(12) United States Patent
Philibert et al.

(10) Patent No.: US 10,561,024 B2
(45) Date of Patent: Feb. 11, 2020

(54) FLEXIBLE PRINTED CIRCUIT BOARD AND CORRESPONDING SECURED CONNECTION METHOD

(71) Applicant: INGENICO GROUP, Paris (FR)

(72) Inventors: Eric Philibert, Saint-Marcellin (FR); Richard Allirot, Corenc (FR)

(73) Assignee: INGENICO GROUP, Paris (FR)

( * ) Notice: Subject to any disclaimer, the term of this patent is extended or adjusted under 35 U.S.C. 154(b) by 85 days.

(21) Appl. No.: 15/691,149

(22) Filed: Aug. 30, 2017

(65) Prior Publication Data

US 2018/0063969 A1 Mar. 1, 2018

(30) Foreign Application Priority Data

Aug. 31, 2016 (FR) .................................... 16 58097

(51) Int. Cl.
| | |
|---|---|
| *H05K 3/36* | (2006.01) |
| *H01R 12/62* | (2011.01) |
| *H01R 12/65* | (2011.01) |
| *H05K 1/02* | (2006.01) |

(52) U.S. Cl.
CPC ............. *H05K 3/363* (2013.01); *H01R 12/62* (2013.01); *H01R 12/65* (2013.01); *H05K 1/028* (2013.01)

(58) Field of Classification Search
CPC ........ H05K 3/363; H05K 1/028; H01R 12/62; H01R 12/65
USPC ........................................................ 174/250
See application file for complete search history.

(56) References Cited

U.S. PATENT DOCUMENTS

| | | | |
|---|---|---|---|
| 4,639,059 A * | 1/1987 | Thepault .............. | H01R 9/2491 439/492 |
| 5,900,587 A | 5/1999 | Piper et al. | |
| 2008/0023214 A1 | 1/2008 | Kuo | |

FOREIGN PATENT DOCUMENTS

EP          0540319 A2     5/1993

OTHER PUBLICATIONS

French Search Report and Written Opinion dated May 18, 2017 for French Application No. 1658097 filed Aug. 31, 2016.
English translation of the French Written Opinion dated May 18, 2017 for French Application No. 1658097 filed Aug. 31, 2016.

\* cited by examiner

*Primary Examiner* — Tremesha S Willis
(74) *Attorney, Agent, or Firm* — David D. Brush; Westman, Champlin & Koehler, P.A.

(57) ABSTRACT

A flexible printed circuit board is proposed. The flexible printed circuit board includes at least one soldering element possessing a soldering face, accessible from a first face of the flexible printed circuit board, and a heating face, accessible from a second face of the flexible printed circuit board. Such a flexible printed circuit board includes a main part including the soldering element, and at least one foldable part, extending from the main part and being configured to pass: from a non-folded state, in which the at least one foldable part does not cover the heating face of the at least one soldering element; to a folded state in which the at least one foldable part covers the heating face of the at least one soldering element.

8 Claims, 4 Drawing Sheets

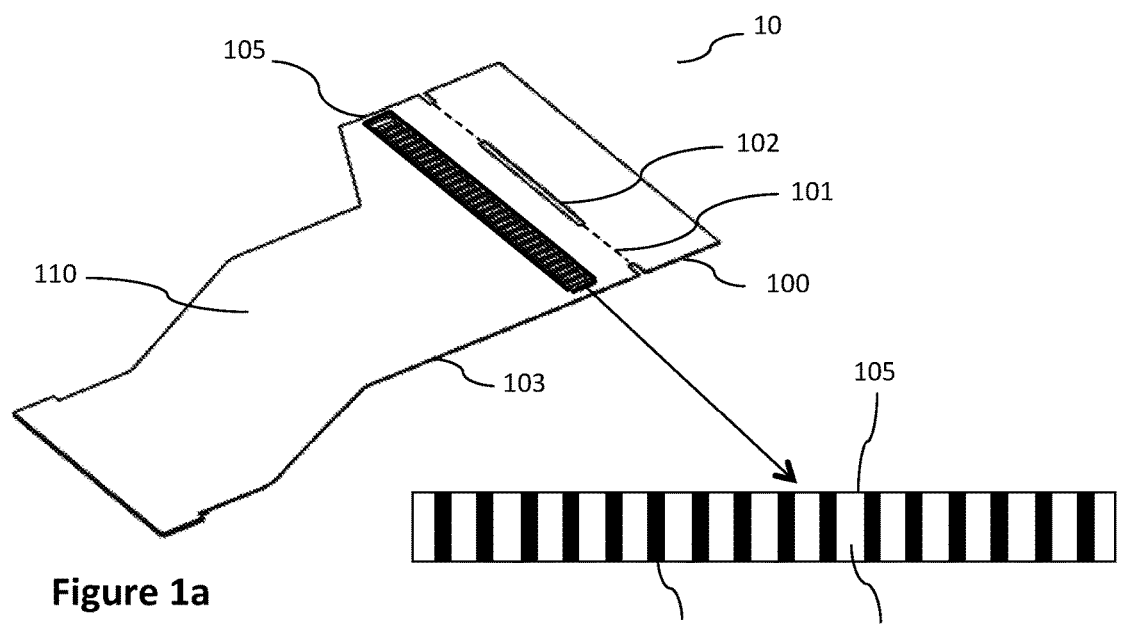
Figure 1a
Figure 1b
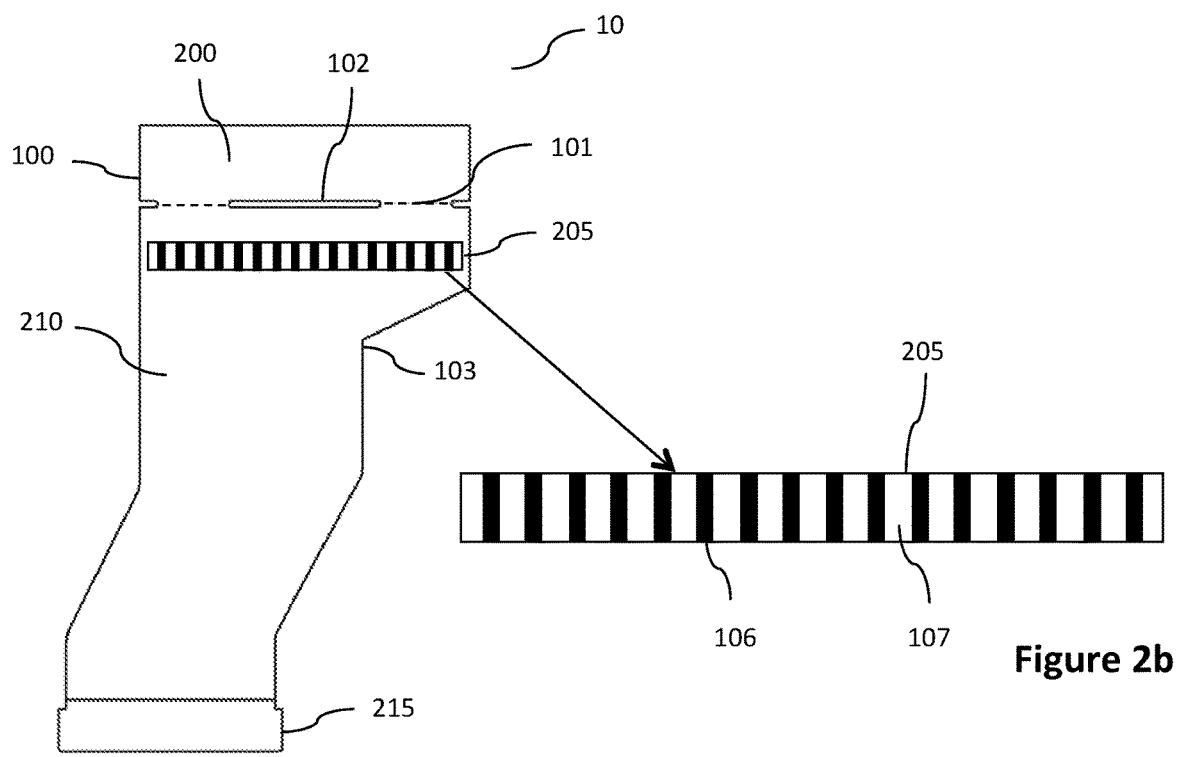
Figure 2a
Figure 2b

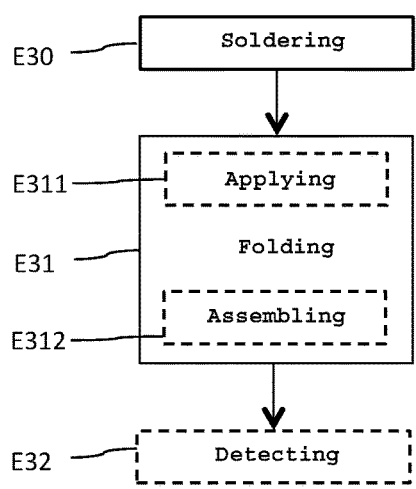
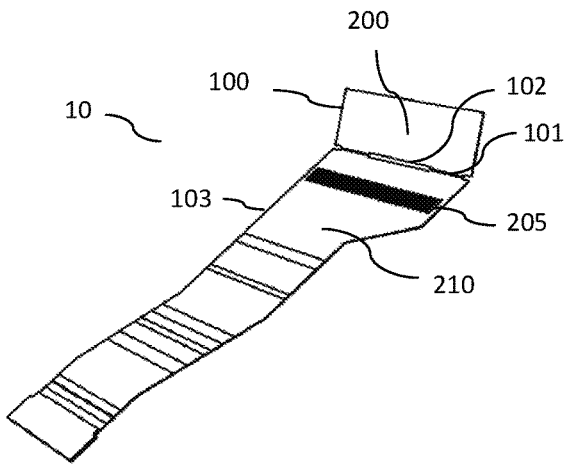
Figure 3
Figure 4a
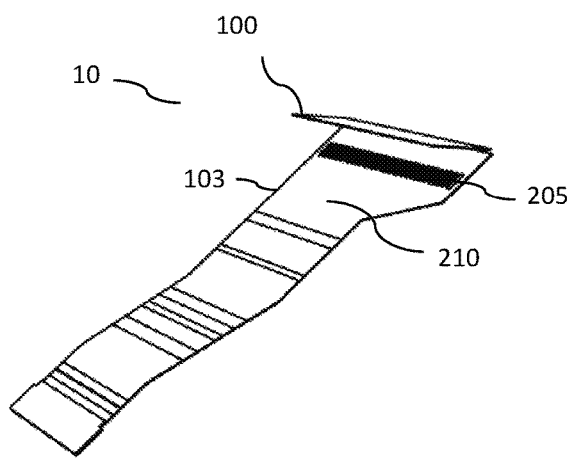
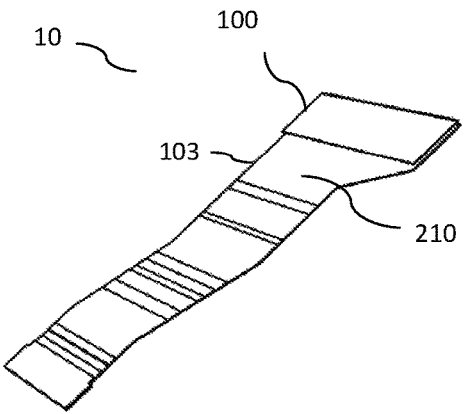
Figure 4b
Figure 4c

FLEXIBLE PRINTED CIRCUIT BOARD AND CORRESPONDING SECURED CONNECTION METHOD

1 TECHNICAL FIELD

The field of the invention is that of flexible printed circuit boards, (or FPC Boards) also called flex PCBs or flex circuits.

More specifically, the invention relates to a flexible printed circuit board as well as to an associated method of secured connection enabling the prevention of access to the signals transiting through the solder (or brazing) points when this circuit is being soldered or brazed to another electronic circuit.

Here below in the description, the terms "soldering" or "solder" and "brazing" or "brazed" are used without any difference of meaning.

Flexible printed circuit boards are very widely used the industry, for example to connect two rigid printed circuits together in complex spatial configurations. Besides, a great many fields require high levels of security in terms of the confidentiality of the electrical signals transiting in apparatuses. The invention thus has numerous applications, especially but not exclusively in the fields of electronic payment terminals, payment card readers etc.

2 TECHNOLOGICAL BACKGROUND

When developing complex electronic functions, it is often necessary to connect different printed circuit boards electrically to one another.

To this end, the use of flexible printed circuit boards (FPC Boards) can prove to be of great interest. Indeed, such flexible links can be used, for example, to connect rigid circuits together in complex spatial configurations, thereby gaining space.

In practice, such an FPC Board comprises a layer of conductive tracks included between two layers of flexible, plastic material, for example polyimide, as well as, possibly, a second layer of conductive tracks disposed on one of the external faces of the FPC board (a face intended for example to implement a security mesh as indicated here below). It follows from this that a soldering technique particularly suited to this type of flexible circuit is the thermode or hot-bar soldering technique.

In practice, two types of implementation of this soldering technique can be envisaged. In the first type (called a single-sided flex implementation), only one of the two layers of flexible, plastic material is perforated so as to enable access to the tracks that are to be soldered. In practice, during the soldering, the tracks made accessible are applied to the points of solder paste preliminarily disposed on the tracks of the printed circuit board to which it is sought to solder them. The thermode or hot bar is then applied to the layer of flexible plastic material disposed on the face of the FPC board opposite the perforated face. Thus, solder paste points are soldered by diffusion of heat, on the one hand through the unperforated layer of flexible plastic to which the hot bar is applied and on the other hand through the tracks to be soldered.

It can be seen however that this first execution entails problems in different respects. First of all, the heating of the layer of flexible, plastic material in contact with the hot bar can lead to its deterioration. This is especially marked as, in order to obtain sufficient heating of the solder paste, the energy that must be furnished to the layer of flexible plastic material is greater than what it would be in the event of direct contact with the tracks to be soldered. These problems are aggravated if the layer of flexible plastic material in contact with the hot bar is be covered with a second layer of conductive track, for example made of copper, this metal being a good heat conductor.

Besides, according to this first technique, excess solder paste cannot be removed by going back on either side of the different soldering tracks: this paste is indeed positioned directly on the plane of the tracks to be soldered and at the level of the printed circuit to which the FPC Board is soldered by the presence of the layer of flexible plastic material in contact with the hot bar. Thus, if there is excess solder paste, a short circuit can appear between two adjacent tracks. Such a phenomenon then leads to additional constraints in the production of the complete electronic system, and thus has an impact on its final cost.

For these different reasons, it is often preferable to move towards a different type of execution of hot-bar soldering in which the two layers of flexible plastic material are both perforated as is the second layer of conductive tracks, if necessary, at the track portion to be soldered (hot-bar soldering of the open-windowed flex type or exposed-lead flex type). Thus, the hot bar is applied directly to the portion of tracks to be soldered which, in this case, are entirely bared, thereby improving the heat transfer. The problems related to the removal of excess solder paste are also resolved (since the holes between the tracks serve to remove excess solder paste).

One drawback of this second type of implementation is that the tracks of the FPC board that were soldered are now accessible. Indeed, since the two layers of flexible plastic material, as well as possibly the second layer of conductive tracks, have been perforated to enable the hot bar to be applied directly to the tracks of the FPC Board, the electrical signals transiting between the FPC Board and the electronic circuit to which it has just been soldered are accessible and can be spied upon. This situation is a particular source of problems in certain fields of application where such access is not authorized, for example in devices that manage confidential data, such as payment terminals, payment card readers etc. Indeed, sensitive signals transit between the printed circuits boards. These sensitive signals for example represent a bank account, a secret code such as for example a PIN (personal Identification number). It is therefore necessary to prevent access thereto.

Besides, known FPC Boards used in such fields of application classically have means for detecting attempted intrusion and access to the signals that transit through the tracks that they include (e.g. security meshes comprising conductive tracks disposed on a second copper layer of the FPC board as described here above). It is thus worthwhile to obtain the same function with regard to the signals transiting through the solder points, i.e. the capacity to be able to detect an attempt to access these signals, and to do so while maintaining the cost of the final solution.

There is thus a need for an FPC Board that can be soldered by a hot-bar soldering method of the "window" or "exposed lead" type while at the same time preventing access to the electrical signals transiting between the FPC board and the electronic circuit to which it has just been soldered.

There is also need for such an FPC Board that provides means for detecting an attempt to access the electrical signals thus protected after soldering.

Finally, there is a need for such an FPC board that leads to a comprehensive solution for controlled costs and compactness.

3 SUMMARY

One embodiment of the invention proposes a flexible printed circuit board comprising at least one soldering element possessing at least one soldering face, accessible from a first face of the flexible printed circuit board, and one heating face, accessible from a second face of the flexible printed circuit board.

Such a flexible printed circuit board also comprises a main part, including said at least one soldering element, and at least one folding or foldable part, extending from said main part and being configured to pass:

from a non-folded state, in which said at least one foldable part does not cover the heating face of said at least one soldering element;
to a folded state in which said at least one foldable part covers the heating face of said at least one soldering element.

Thus, the invention proposes a novel and inventive solution that enables the securing of an FPC board that is to be soldered, for example to another electronic circuit, by means of a soldering technique necessitating access to the soldering elements from both faces of the FCP board (such as for example the technique of «hot-bar» soldering, especially in its implementations known as the «window» implementation and the «exposed lead» implementation.

To this end, the FPC board according to the invention has a foldable part intended to cover the heating face of the FPC board soldering elements. As a result, the solder points obtained become inaccessible, thus prohibiting spying on the signals that travel therein.

Besides, the proposed solution involves only an additional portion of FPC board (i.e. the foldable part) as compared with a prior-art FPC board. The cost of the proposed solution thus remains minimal.

Finally, the FCP board thus obtained after folding remains quite flat, thus minimizing the space requirement of the full electronic system obtained after assembling.

According to one embodiment, said at least one soldering element is included in a window cut out in said main part.

Thus, the technique described is particularly suited to the technique of hot-bar soldering in its implementation known as «window» soldering.

In one embodiment of the invention, said at least one soldering element extends from an external side of said main part.

Thus, the described technique is also applicable to the technique of hot-bar soldering in its implementation known as the «exposed lead» implementation.

According to one particular characteristic, said main part comprises at least two connection areas, each comprising at least one soldering element, and for each of said at least two connection areas, at least one foldable part.

In one embodiment, said at least one foldable part comprises a security mesh comprising at least one first conductive track and covering at least said at least one soldering element when said at least one foldable part is in the folded state.

Thus, since the foldable part forms an integral part of the FPC board, it benefits from the devices that this flexible printed circuit integrates in order to detect any attempt to access the signals that transit through the tracks included between the two layers of flexible plastic material that compose it. In particular, a mesh disposed on the foldable part can be connected to other intrusion detecting devices present on main part, without any need to duplicate the corresponding detection systems in the complete electronic system in which the FPC board is embedded. As a result, a cutting of the conductive tracks of the mesh caused by an attempt to pierce the foldable part in order to access the signals transiting through the solder points can be easily detected by the detection systems initially planned in the complete electronic system for the detection of intrusions in the main part: this can be done without any extra cost for the complete electronic system.

According to one embodiment, the flexible printed circuit board comprises means for detecting a lifting of said at least one foldable part when said at least one foldable part is in the folded state.

Thus, attempts to access the solder points by lifting the foldable part are detected.

In one embodiment, said means for detecting a lifting comprise at least one pair of first and second electrical contacts, said first electrical contact being positioned on the main part and being configured to come into contact with said second electrical contact positioned on said at least one foldable part when said at least one foldable part is in the folded state.

Thus, the electrical circuit established via the first and second electrical contacts opens in case of a lifting of the foldable part in order to access the solder points, thereby making it possible to detect attempts at intrusion.

In one embodiment, said means for detecting a lifting comprises at least one portion of a second conductive track located in said at least one foldable part and made with a conductive ink.

This embodiment can advantageously be combined with a bonding of the foldable part on the main part in the folded state. Indeed, such a conductive ink (for example a carbon, silver or copper ink) can be easily torn off in the event of an attempt to detach the foldable part, thereby making it possible to detect an attempted intrusion through the presence of the open electrical circuit that results therefrom.

According to one embodiment, said at least one portion of the second conductive track is included in said security mesh.

Thus, the mesh makes it possible to carry out both the function of detecting the piercing and that of detecting the lifting the foldable part in the folded state.

Another embodiment of the invention proposes a method for the secured connection of a flexible printed circuit board, as described here above, to another circuit. Such a method of secured connection comprises:

a step for soldering said at least one soldering element to said other circuit, said at least one foldable part being in said non-folded state; then
a step for folding said at least one foldable part, to take said at least one foldable part into said folded state.

Such a method therefore enables the secured connection of an FPC board according to the invention (according to any one of its different embodiments) to another circuit. Thus, the characteristics and advantages of this method are the same as those of the FPC board described earlier. In particular, the execution of the claimed method makes the solder points obtained inaccessible, thus prohibiting spying on signals that travel therein. Besides, the proposed solution involves only an additional portion of FPC board (i.e. the foldable part) as compared with a prior-art FPC board. The cost of the proposed solution thus remains minimal and the FCP obtained after folding down remains quite flat.

In one embodiment, said step for folding comprises a sub-step for applying an adhesive material in at least one part of an area of partial overlapping of the main part by said at least one foldable part, when said at least one foldable part is in the folded state.

Thus, a track of conductive ink (for example a carbon, silver or copper ink) present on the foldable part can be easily torn off in the event of an attempt to detach the foldable part, thereby making it possible to detect an attempted intrusion through the presence of the open electrical circuit that results from this attempt In one embodiment, said step for folding comprises a sub-step for the indirect assembling of the main part with said at least one foldable part, by the use of at least one intermediate part.

Thus, the FPC board obtained by the implementing of the claimed method is capable of maintaining electrical contact between contacts disposed on the foldable part and on the main part, thereby making it possible to detect an attempt to lift the foldable part in order to access the solder points.

In one embodiment, said step for folding is followed by a step for detecting a lifting of said at least one foldable part, when said at least one foldable part is in the folded state.

Thus, any attempt to access the signals that transit through the solder points obtained is detected.

4 LIST OF FIGURES

Other features and advantages of the invention shall appear from the following description, given by way of an indicative and non-exhaustive example and from the appended drawings, of which:

FIGS. 1a and 2a respectively illustrate a first face and a second face of an FPC board according to one embodiment of the invention;

FIG. 1b is a magnified view of the soldering area present on the first face of FIG. 1a;

FIG. 2b is a magnified view on the heating area present on the second face of FIG. 2a;

FIG. 3 is a flow chart of a method for securing an FPC board according to one embodiment of the invention;

FIGS. 4a, 4b and 4c illustrate the successive states of the FPC board during the implementation of the method of FIG. 3;

5 DETAILED DESCRIPTION OF THE INVENTION

Figure 5:
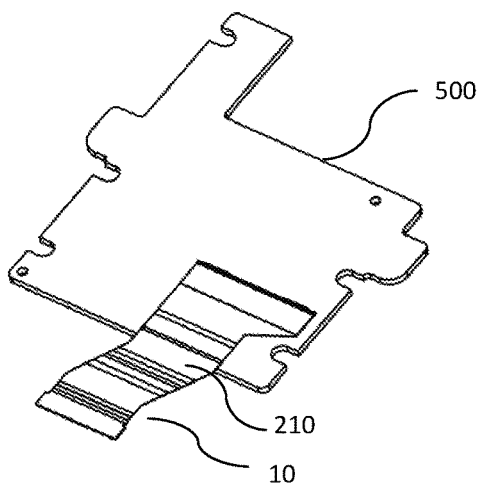
FIG. 5 illustrates the result of the soldering and of the securing of the FPC board of FIGS. 1a and 2a to a rigid printed circuit board.

In all the figures of the present document, the identical elements and steps are designated by the same references.

The general principle of the technique described consists of an FPC board comprising soldering elements, also called «soldering pads», each possessing a soldering face, accessible from a first face of the flexible printed circuit board, and a heating face, accessible from a second face of the flexible printed circuit board. the FPC board furthermore comprises a main part, comprising elements to be soldered and a foldable part, extending from the main part and configured to pass from a non-folded state, in which it does not overlap the faces to be heated of the soldering element, to a folded state in which it overlaps the faces to be heated of the soldering elements. As a result, the soldering pads as well as the electrical signals that transit therein are no longer accessible after soldering despite the use of a «window» type or «exposed lead» type of hot-bar soldering technique.

Referring now to FIGS. 1a and 2a, a description is given of a first face 110 and a second face 210 of an FPC board 10 according to one embodiment of the invention while FIGS. 1b and 2b, show a magnified view of the corresponding soldering area 105 and heating area 205.

In this embodiment, the FPC board 10 has a first face 110 comprising a soldering area 105 in which there are soldering elements 106, i.e. portions of tracks of the FPC board 10 that have to be soldered, for example, to another printed circuit (for example a rigid printed circuit referenced 500 in FIG. 5 described here below).

The soldering area 105 is a bare area, i.e. an area from which the layer of flexible plastic material (e.g. of the polyimide type) present on the first face 110 of the FPC board 10 has been removed so as to expose the soldering elements 106.

Besides, the soldering area 105 has holes 107 passing through the FPC board 10 and opening on to the second face 210 of the FPC board 10 in its heating area 205. The soldering area 105 and the heating area 205 thus define a window comprising the holes 107 and the soldering elements 106. The heating area 205 is also a bare area, i.e. an area from which the layer of flexible plastic material (e.g. of the polyimide type) present on the second face 210 of the FPC board 10 has been removed so as to expose all the soldering elements 106. The heating area is meant to receive the thermode or hot bar with the aim of soldering the soldering elements 106 to the other printed circuit (500) on the soldering area 105 side, thus implementing a "window" type hot-bar soldering technique.

Besides, the FPC board 10 has a foldable part 100 configured to be (i.e. capable of being and meant to be) folded on the heating area 205 so as to prevent access to the electrical signals transiting through the soldering elements 106 once soldered. More particularly, the foldable part 100 has a contact-making face 200 corresponding to a first part of the second face 210 of the FPC board 10 and meant to come into contact with a second part of the second face 210 of the FPC board 10, at the heating area 205.

Besides, the foldable part 100 is demarcated from the rest of the FPC board 10 (also called a main part 103 of the FPC board 10) by a folding groove 101 herein comprising slots 102 that facilitate the folding. The folding groove 101 is used to fold the foldable part 100 on the heating area 205 in such a way that the foldable part 100 is positioned perfectly against the main part 103 of the FPC board 10. the FPC board 10 thus obtained after folding remains particularly flat, thus minimizing the space requirement of the FPC board 10.

According to this embodiment, the FPC board 10 comprises a soldering area 105 and a heating area 205 that are superimposed, enabling it to be assembled (soldered) according to the technique described with another printed circuit (500). The FPC board 10 comprises, at another extremity, a card-to-card connector 215 so as to be reversibly connected to yet another printed circuit. In other embodiments, the FPC board is connected to different printed circuits in using the technique described and then has different soldering areas and different corresponding heating areas.

Referring now to FIGS. 3, 4a, 4b and 4c, a description is provided of the steps of a method for securing an FPC board 10 according to one embodiment of the invention.

At a soldering step E30, the soldering elements 106 of the FPC board 10 are soldered to electrical conductors (for example tracks) of a rigid printed circuit (500).

More particularly, solder paste points are first of all disposed on the relevant tracks of the rigid printed circuit.

Then, the soldering elements 106 of the FPC board 10 are disposed against the solder paste points, the first face 110 of the FPC board 10 being therefore oriented towards the rigid printed circuit (500), and the soldering area 105 being placed flat against the tracks of the rigid printed circuit on which the solder paste points are disposed.

A «hot bar» is then put on the heating area 205 so that it is in contact with the soldering elements 105. Thus, the soldering compound is heated until it reaches a melting point by conduction of the heat provided by the hot bar through the soldering elements 106.

Once the soldering elements 106 have been soldered to the tracks of the rigid printed circuit board, the FPC board 10 is secured during a folding step E31.

More particularly, the foldable part 100 is folded on the heating area 205 by folding at the folding groove 101 (herein comprising three slots). FIGS. 4a, 4b and 4c illustrate the state of the FPC board before, during and after folding respectively. Thus, the contact-making face 200 is placed flat against the second face 210 of FPC board 10. The result of this is that the soldering elements 106 are no longer accessible from the second face 210 of the main face 103 of the FPC board 10, thereby prohibiting access to the electrical signals that travel therein. Besides, the FPC board 10 thus obtained after folding remains particularly flat, thereby minimizing the space requirement of the FPC board 10 once it is made secure.

In one implementation, the folding step E31 comprises a sub-step E311 for applying an adhesive material to at least one part of an area of partial overlap of the main part 103 by the foldable part 100 before these two parts are put into contact. Thus, the contact-making face 200 of the foldable part 100 is glued to the second face 210 of the FPC board 10.

In one variant which may or may not be combinable with the implementation described here above, executing the sub-step E311 for applying an adhesive material, the folding step E31 comprises a sub-step E312 for the indirect assembling of the main part 103 with the foldable part 100. Thus, the foldable part 100 is held by pressure on the second face 210 of the main part of the FPC board 10 by the use of at least one intermediate part 650 as described here below with reference to FIG. 6c.

In another variant, the folding step E31 is followed by a step E32 for detecting a lifting of the foldable part 100 when this foldable part is folded on the heating area 205, the contact-making face 200 being placed flat against the second face 210 of the FPC board 10. Thus, any attempt to access the signals that transit through the solder points obtained is detected, for example by applying the means described here below with reference to FIGS. 6a, 6b and 6c.

Referring now to FIG. 5, a description is provided of an FPC board 10 according to one embodiment of the invention after soldering to a rigid electronic printed circuit board (PCB) 500 and after the folding of the foldable part 100.

It is thus seen that the heating area 205, and therefore also the soldering elements 106, are no longer accessible from the second face 210 of the FPC board 10 when the foldable part 100 has been folded over the heating area 205 during an execution of the step E31 of the method described here above with reference to FIG. 3.

Figure 6A:
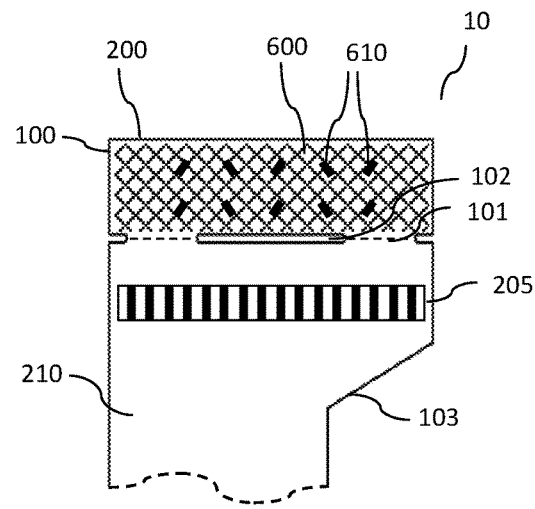
FIGS. 6a, 6b and 6c illustrate different embodiments of means for detecting an attempt to access the signals exchanged between the FPC board and a circuit to which it is soldered.
Figure 6B:
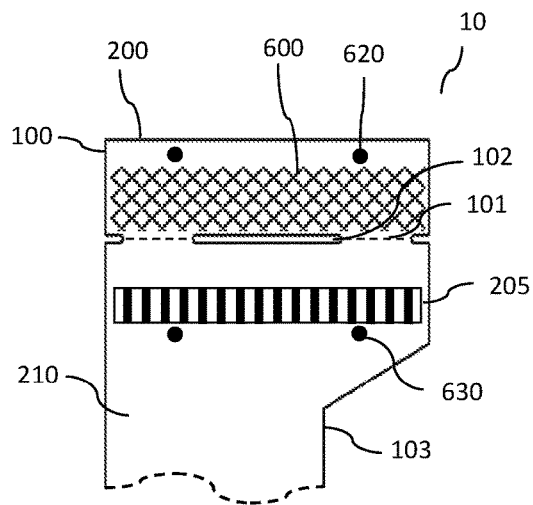
Figure 6C:
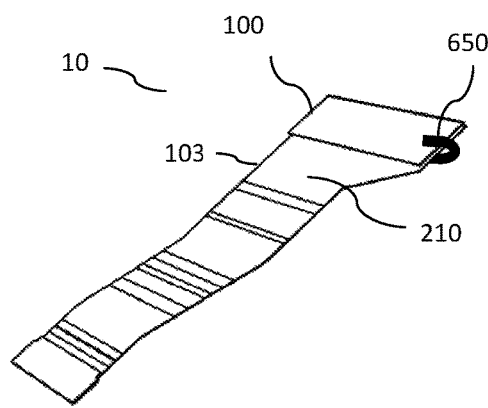

Referring now to FIGS. 6a, 6b and 6c, a description is provided of different embodiments of means for detecting an attempt to access signals exchanged between the FPC board and a circuit to which it is soldered.

In a first embodiment illustrated in FIG. 6a, the foldable part 100 comprises a conductive mesh 600 that is to detect an attempt to access the signals transiting through the soldering elements 106, for example by perforation of the foldable part 100 once it is folded over the heating area 205. Indeed, the open circuit (or the short circuit) in the mesh resulting from the attempt to make a perforation can easily be detected (e.g. through means for detecting impedance variations well known to those skilled in the art).

In one variant, this mesh is connected to a security mesh present on the main part 103. Thus, the detection means initially planned to detect a piercing of the security mesh present on the main part 103 (e.g. by means of a processor or a dedicated circuit to which the meshes in question are connected via a bus) are also capable of detecting a piercing of the conductive mesh 600 present in the foldable part 100: they can do so without requiring any particular adaptation. The detection of an attempt to pierce the foldable part in order to access the signals transiting through the solder points is thus easily detected, without extra cost for the complete electronic system in which the FPC board is embedded.

In a second embodiment also illustrated in FIG. 6a, the contact-making face 200 comprises sections of conductive ink tracks 610 (for example using a carbon, silver or copper ink). Besides, the contact-making face is glued to the second face 210 of the FPC board 10 after soldering of the soldering elements 106, for example following an execution of the sub-step E311 for applying an adhesive material described here above with reference to FIG. 3. Thus, the tracks made of conductive ink 610 are torn off in the event of an attempt to detach the foldable part 100. As a result, any attempt at intrusion by detachment of the foldable part 100 is detected via the presence of the open electrical circuit that results from the breaking of the conductive ink tracks 610 during an execution of the detection step E32 also described here above with reference to FIG. 3.

The second embodiment may or may not be combined with the first embodiment. Should the first and second embodiments be combined, the sections of conductive ink tracks 610 form part of the conductive mesh 600.

In a third embodiment illustrated in FIGS. 6b and 6c (and capable of being combined with the first embodiment), the contact-making face 200 comprises first conductive devices 620 intended for cooperating with second conductive devices 630 present on the second face 210 of the main part 103 of the FCP board, herein placed in proximity to the heating area 205. Thus, when the foldable part 100 is folded, the first conductive device 620 and second conductive device 630 are put into electrical contact. To this end, the foldable part is held in place by pressure on the second face 210 of the FPC board 10. This holding is achieved for example by means of a clamping device 650 thus executing a sub-step E312 for the indirect assembling of the main part 103 with the foldable part 100 as described here above with reference to FIG. 3. Thus, in the event of an attempt to lift the foldable part 100 once it is placed on the heating area 205, the electrical contact between the first conductive device 620 and second conductive device 630 is open, thereby making it possible to detect an attempted intrusion during an execution of the detection step E32 described here above with reference to FIG. 3.

Figure 7:
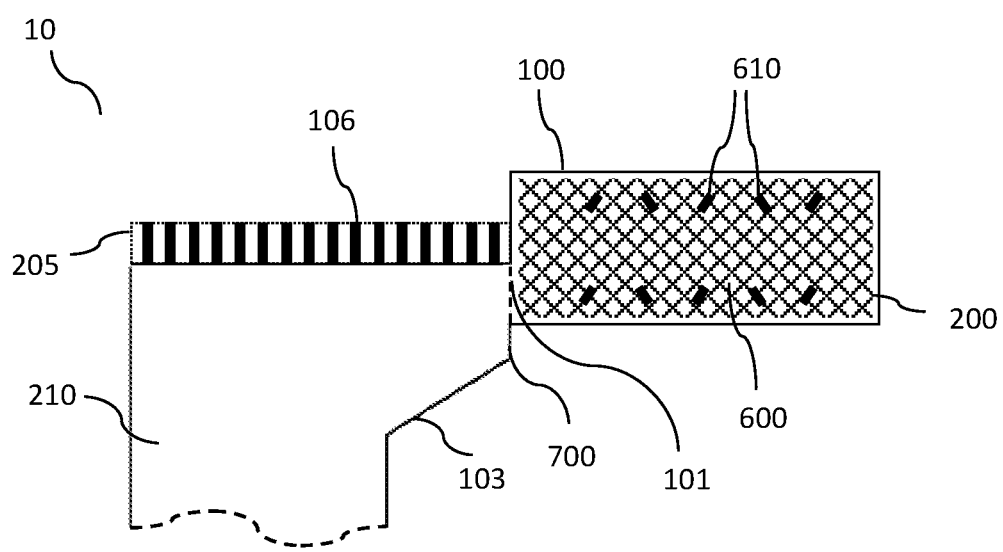
FIG. 7 illustrates the second face of an FPC board according to one embodiment of the invention

Referring to FIG. 7, a description is now provided of an FPC board 10 according to another embodiment of the invention before soldering to another electronic printed circuit board and before the folding of the foldable part 100.

Indeed, the embodiments illustrated in FIGS. 1a, 1b, 2a, 2b, 4a, 4b, 6a and 6b correspond to «window» type configurations, namely configurations where the heating area is surrounded by flexible plastic material. However, the described technique, according to any one of its different embodiments, can be applied in the same way to an "exposed lead" type of configuration in which the soldering elements 105 are visible at one extremity of the FPC board 10 extending from an external side 700 of the main part 103 as illustrated in FIG. 7.

The invention claimed is:

1. A flexible printed circuit board comprising:
   first and second faces;
   at least one soldering element possessing at least one soldering face, accessible from the first face of the flexible printed circuit board, and at least one heating face, accessible from the second face of the flexible printed circuit board;
   a main part comprising said at least one soldering element; and
   at least one foldable part, extending from said main part and being configured to pass:
      from a non-folded state, in which said at least one foldable part does not cover the at least one heating face of said at least one soldering element; and
      to a folded state in which said at least one foldable part covers the at least one heating face of said at least one soldering element and in which said at least one foldable part is in contact with said at least one heating face.

2. The flexible printed circuit board according to claim 1, wherein the at least one soldering element is included in a window cut out in said main part.

3. The flexible printed circuit board according to claim 1, wherein said at least one soldering element extends from an external side of said main part.

4. The flexible printed circuit board according to claim 1, wherein said at least one foldable part comprises a security mesh comprising at least one first conductive track and covering at least said at least one soldering element when said at least one foldable part is in the folded state.

5. The flexible printed circuit board according to claim 1, which further comprises means for detecting a lifting of said at least one foldable part when said at least one foldable part is in the folded state.

6. The flexible printed circuit board according to claim 5, wherein said means for detecting a lifting comprise at least one pair of first and second electrical contacts, said first electrical contact being positioned on the main part and being configured to come into contact with said second electrical contact positioned on said at least one foldable part when said at least one foldable part is in the folded state.

7. The flexible printed circuit board according to claim 5, wherein said means for detecting a lifting comprises at least one portion of a second conductive track located in said at least one foldable part and made with a conductive ink.

8. The flexible printed circuit board according to claim 7, wherein said at least one foldable part comprises a security mesh comprising at least one first conductive track and covering at least said at least one soldering element when said at least one foldable part is in the folded state, and wherein at least one portion of the second conductive track is included in said security mesh.

* * * * *